US009638779B2

(12) United States Patent
Wang et al.

(10) Patent No.: US 9,638,779 B2
(45) Date of Patent: May 2, 2017

(54) EQUIPMENT AND METHOD FORECASTING TUNNEL WATER INRUSH USING MAGNETIC RESONANCE DIFFERENTIAL

(75) Inventors: Yingji Wang, Jilin (CN); Jun Lin, Jilin (CN); Shuqin Sun, Jilin (CN); Chuandong Jiang, Jilin (CN); Jianpeng Wang, Jilin (CN); Bo Pang, Jilin (CN); Zhe Zhang, Jilin (CN)

(73) Assignee: JILIN UNIVERSITY, Jilin (CN)

( * ) Notice: Subject to any disclaimer, the term of this patent is extended or adjusted under 35 U.S.C. 154(b) by 581 days.

(21) Appl. No.: 14/119,110

(22) PCT Filed: May 17, 2012

(86) PCT No.: PCT/CN2012/075659
§ 371 (c)(1),
(2), (4) Date: Nov. 20, 2013

(87) PCT Pub. No.: WO2012/159546
PCT Pub. Date: Nov. 29, 2012

(65) Prior Publication Data
US 2014/0091789 A1    Apr. 3, 2014

(30) Foreign Application Priority Data
May 23, 2011    (CN) .......................... 2011 1 0133921

(51) Int. Cl.
*G01V 3/00*    (2006.01)
*G01R 33/54*    (2006.01)
(Continued)

(52) U.S. Cl.
CPC .............. *G01R 33/54* (2013.01); *G01V 3/14* (2013.01); *G01V 9/02* (2013.01)

(58) Field of Classification Search
CPC ............. G01R 33/54; G01V 3/14; G01V 9/02
(Continued)

(56) References Cited

U.S. PATENT DOCUMENTS

| 8,436,609 B2 * | 5/2013 | Srnka ..................... G01V 3/175 324/303 |
| 2006/0119357 A1 | 6/2006 | Alvarez et al. |
| 2008/0284426 A1 * | 11/2008 | Shorey ..................... G01V 3/14 324/307 |

FOREIGN PATENT DOCUMENTS

| CN | 1763563 | 4/2006 |
| CN | 101251607 | 8/2008 |

(Continued)

OTHER PUBLICATIONS

International Search Report for corresponding PCT Application No. PCT/CN2012/075659, dated Aug. 30, 2012.

*Primary Examiner* — Susan Lee
(74) *Attorney, Agent, or Firm* — Caesar Rivise, PC

(57) ABSTRACT

An equipment and method for forecasting tunnel water inrush using a magnetic resonance differential, where a computer is connected to a transmitting bridge circuit through a high voltage power supply, to a control unit, a first and second signal modulating circuits and a multi-channel collecting circuit; the control unit is connected to a transmitting driver circuit, a first and second protection switches, and the transmitting bridge circuit through the transmitting driver circuit; two ends of a transceiving multi-turn coil are connected to the multi-channel collecting circuit through the first and second protection switches; two ends of a receiving multi-turn coil are connected to the multi-channel collecting circuit through the second protection switch and the second signal modulating circuit; one end of the transceiving multi-turn coil is connected to the transmitting bridge circuit, and the other end is connected to the transmitting bridge circuit through a resonant capacitor.

3 Claims, 3 Drawing Sheets

(51) Int. Cl.
*G01V 3/14* (2006.01)
*G01V 9/02* (2006.01)

(58) Field of Classification Search
USPC .......................................................... 324/306
See application file for complete search history.

(56) References Cited

FOREIGN PATENT DOCUMENTS

| CN | 102053280 | 5/2011 |
|---|---|---|
| CN | 102062877 | 5/2011 |
| CN | 102221711 | 5/2013 |

\* cited by examiner

EQUIPMENT AND METHOD FORECASTING TUNNEL WATER INRUSH USING MAGNETIC RESONANCE DIFFERENTIAL

CROSS-REFERENCE TO RELATED APPLICATIONS

This national stage application claims the benefit under 35 U.S.C. §371 of International Application No. PCT/CN2011/075659 filed on May 17, 2012, entitled TUNNEL WATER INRUSH ADVANCE PREDICTION DEVICE USING NUCLEAR MAGNETIC RESONANCE DIFFERENCE AND METHOD, which in turns takes its priority from Chinese Patent Application No. 201110133921.1, filed May 23, 2011, and all of whose entire disclosures are incorporated by reference herein.

FIELD OF THE INVENTION

The present invention relates to a geophysical exploration equipment for precisely locating water stratums around a tunnel using a magnetic resonance sounding theory, especially to a detecting equipment and method based on a magnetic resonance differential, which is suitable for precisely locating water stratums around a tunnel (e.g., water stratums at the upper, lower, left or right side of the tunnel) by using two parallel coils, i.e. a transceiving coil and a receiving coil.

BACKGROUND OF THE INVENTION

When digging a tunnel or mine, because of the complicated geological conditions, a geological disaster, such as underground water inrush, happens from time to time. This brings huge a catastrophe and economic lost to construction. The precise detection of regions containing water stratums around an underground engineering such as a tunnel can provide significant information for reducing water inrush accidents caused by unknown water stratums.

Presently, the tunnel water inrush forecasting technology mainly include below.

Geological observation method: according to geological investigation results of the inside and outside of a tunnel, the possibility of a water stratum in front of a tunnel face is analyzed and determined. This method depends on experiences and knowledge of the engineering geological conditions of a tunnel site of forecasters.

Ground hole method: which is a direct detection method and advantageous on fissured water of bedrock, however, there is a danger of hole over-flowing to cavern water and surge water of fault fractured zone with a good transmissivity which contacts surface water.

Infrared water detecting method: which uses infrared radiation field abnormalities caused by underground water stratums to detect a water stratum. This method can determine whether surrounding rock mass contains a water stratum, but cannot ascertain the volume of the water stratum; in addition, this method is influenced by tunnel construction seriously.

Full-wave apparent resistivity method: in which the resistivity difference between a water stratum and a rock mass is used to judge whether a water stratum exits and the outline of the water stratum, but this method is difficult to distinguish silt whose apparent resistivity parameter has no significant difference from water.

Transient electromagnetic method: in which a bunch of pulse electromagnetic field (which is called as a primary field) is emitted in front of a working face of a tunnel, and a receiving probe is used to measure vortex flow changes induced by a target body during a gap of the primary field. The changes depend largely on the resistivity and polarizability of the target body. This method cannot distinguish the geological body (such as sludge) whose resistivity and polarizability parameters have no obvious difference from water.

Seismic wave method: in which a seismic detection equipment is used to stimulate artificial seismic waves, and the waves' signal spreads through a rock mass around a tunnel, and when meeting a differentia interface with characteristic impedance of rock (e.g. the location in which the rock's strength changes, stratum lay and joint plane), especially a fault fractured zone interface and a bad geological interface such as karst cave, underground river, karst and silt, a portion of the signal is reflected back and a portion of the signal transmits into a front medium, and the reflected signal will be received by a detector of the detection equipment. Property of the geologic body in front of the tunnel's working face (e.g. soft rock zone, fractured zone, fault and water-bearing rock layer, etc.) can be known by software processing basing on the returned signal's delay time, strength and direction, and thereby a possible water-bearing structure may be deduced. So this method is based on a calculated geological structure to predict the water-bearing structure, but it can't decide whether it is water-bearing or not.

Acoustic sounding method: in which a rock is cut by a tunneler to stimulate an acoustic signal, and a synchronizing signal detector detects the reflected signal which is in front of a working face and reflected by the rock. Through analysis and calculation, the front geological structure is reduced and a possible water-bearing structure is estimated. It is an indirect method as well, and cannot locate an underground water stratum directly.

Temperature differential method: in general, with the increasing depth, the temperature of a rock body underground is higher and higher. But an underground water-bearing body and its flow in the rock will reduce (for conventional water stratums) or increase (for underground hot water stratums) the temperature of the rock body around the water stratum in certain scope. Making use of this phenomenon, it might predict a possible front water stratum by measuring the temperature variation in a tunnel. However, it can't draw accurately the significant parameters such as water content size of the potential water stratum.

Most of these methods judge whether there is a water stratum by investigating a water-bearing structure and its horizon. They are indirect measuring methods and cannot draw accurately the significant parameters of the water volume size of the potential water stratum. On the contrary, the underground water detecting method based on a magnetic resonance is a direct method.

"The surface magnetic resonance theories and methods" (2000.8, Wuhan, China university of geosciences press, ISBN 7-5625-1551-4) by Yulin Pan and Changda Zhang introduces an equipment for detecting water stratums based on magnetic resonance in France, which comprises an emission system, a receiving signal system, a microprocessor control and a register system and so on. The most beneficial effect is to detect the underground water within 150 meters depth directly.

Master dissertation of Yanqiu Jiang of Jilin University in 2006 "The Transmitter Development of SMRS Instrument for Groundwater Investigation" introduces each circuit design of a transmitter in a NUMIS. Master dissertation of Dongxu Gao of Jilin University in 2008 "Implementation of Weak SMRS Signal Amplifier for Groundwater Investigation" introduces a design of a signal modulating circuit. Master dissertation of Chuandong Jiang of Jilin University in 2009 "Design and Application of Data Processing Software in Magnetic Resonance Sounding System for Groundwater Detection" introduces one type of such method which gets underground water-bearing layer's thickness, moisture content and the distance from water to a transceiving coil, estimates permeability, conductivity and surge water amount according to the parameter of MRS underground water detecting signal, such as the stimulated emission current, emission duration, initial amplitude and relaxation time of the received MRS signal. 2010SR017733 computer software copyright registers "JLMRS data processing software", the computer software accomplishes calculation of hydrogeology parameters, including distance between an aquifer and a transceiving coil, thickness of water layer, moisture content, permeability, conductivity and the surge water amount, in magnetic resonance detection.

Theoretically, a magnetic resonance signal may be generated as long as water exists. But whether the magnetic resonance signal could be detected or not depends on the sensitivity of the detecting equipment. The bigger the water stratum is and the nearer the distance is, the stronger the magnetic resonance signal is, and thus the signal is easier to be detected, while such potential big water stratum may be more harmful to a tunneling progress. Based on the sensitivity achieved at present, such water stratums which affect the engineering as above could be detected.

Water stratums in a geological region may exist not only in the direction along which the tunnel advances, but also in two lateral sides, roof and floor of the tunnel, which causes a significant potential trouble to safety.

SUMMARY OF THE INVENTION

In view of the drawbacks in the prior art, one aspect of the present invention aims at providing equipment for forecasting tunnel water inrush using a magnetic resonance differential.

Another aspect of the present invention is to provide a method for forecasting tunnel water inrush using a magnetic resonance differential.

The purpose of this invention is achieved by technical solutions below.

There is provided an equipment for forecasting tunnel water inrush using a magnetic resonance differential, in which: a computer is connected to a transmitting bridge circuit via a high voltage power source by a serial bus, is connected to a control unit by a serial bus, is connected to a signal modulating circuit by a serial bus, is connected to a multi-channel collecting circuit by a serial bus, and is connected to a second signal modulating circuit by a serial bus; the control unit is connected to a transmitting driver circuit by a control line, and is respectively connected to a first protection switch and a second protection switch by control lines to control the opening and closing of the first protection switch and the second protect switch; both ends of an integrative transceiving multi-turn coil are connected to the multi-channel collecting circuit by the first protection switch and the first signal modulating circuit, and both ends of a receiving multi-turn coil are connected to the multi-channel collecting circuit by the second protection switch and the second signal modulating circuit; one of both ends of the transceiving multi-turn coil is connected to the transmitting bridge circuit, and the other end of the transceiving multi-turn coil is connected to the transmitting bridge circuit via a resonant capacitor; the control unit is connected to the transmitting bridge circuit by the transmitting driver circuit; wherein, the computer controls the high voltage power source by setting the size of the output voltage of the high voltage power source, and hence changes the size of transmission current in the transceiving multi-turn coil and the resonant capacitor through the transmitting bridge circuit, so that stimulated magnetic fields with different intensities are generated to stimulate water stratums at different distances; the control unit generates a control signal with a Larmor frequency of 20-30 milliseconds (ms), to control the transmitting bridge circuit via the transmitting driver circuit.

A method for forecasting tunnel water inrush using a magnetic resonance differential includes the following steps a)-j).

a) The transceiving multi-turn coil and the receiving multi-turn coil are placed in a target detection region such as two lateral sides of a tunnel, where the transceiving multi-turn coil may be laid vertically on the left side of tunnel while the receiving multi-turn coil is laid vertically on the right side of the tunnel which is opposite to the transceiving multi-turn coil.

b) The above equipment for forecasting tunnel water inrush using a magnetic resonance differential is turned on, and the computer sends a detecting command to the control unit, which thereby controls the first protection switch and the second protection switch to be opened so as to protect the first signal modulating circuit and the second condition circuit.

c) The control unit generates a control signal with a Larmor frequency of 20-30 ms, and controls the transmitting bridge circuit via the transmitting driver circuit.

d) The computer controls the high voltage power source by the serial bus to set and change the size of the output voltage of the high voltage power source, and further changes the size of the transmission current in the transceiving multi-turn coil and the resonant capacitor via the transmitting bridge circuit, so that stimulated magnetic fields with different intensities are generated to stimulate water stratums at different distances.

e) When a time interval of 20-30 ms expires after the emission of the stimulated magnetic field is finished, the control unit controls the first protection switch and the second protection switch to be closed, to send the signal received by the transceiving multi-turn coil to the first signal modulating circuit by the first protection switch, and send the signal received by the receiving multi-turn coil to the second signal modulating circuit by the second protection switch.

f) The first signal modulating circuit and the second signal modulating circuit filter and amplify the received signals (e.g., the signal from the transceiving multi-turn coil at the left side and the signal from the receiving multi-turn coil at the right side), respectively, the computer controls the first signal modulating circuit by the control line to amplify and filter the received signal (e.g., the signal from the transceiving multi-turn coil at the left side), and then sends the amplified and filtered signal to the multi-channel collecting circuit. Further, the computer controls the second signal modulating circuit by the serial bus to amplify and filter the received signal (e.g., the signal from the receiving multi-turn coil at the right side), and then sends the amplified and filtered signal to the multi-channel collecting circuit. The computer controls the starting and ending time of the signal collection conducted by the multi-channel collecting circuit by the serial bus. The analog signals outputted from the first signal modulating circuit and the second signal modulating circuit are converted into digital signals by an Analog-to-Digital (A/D) converter of the multi-channel collecting circuit, and then the digital signals obtained from the conversion are sent to the computer via the serial bus for further storing and processing.

g) The magnetic resonance signals received by the transceiving multi-turn coil and the receiving multi-turn coil are processed by the computer to obtain parameters such as relaxation time, initial amplitude and phase shift.

h) The computer determines the relative location of the water stratum by differential deduction. If the initial amplitude of the signal received by the transceiving multi-turn coil is higher than the initial amplitude of the signal received by the transceiving multi-turn coil, the water stratum is on the side of the placed transceiving multi-turn coil (e.g. the left side); if the initial amplitude of the signal received by the transceiving multi-turn coil is lower than the initial amplitude of the signal received by the transceiving multi-turn coil, the water stratum is on the side of the placed transceiving multi-turn coil (e.g. the right side). If the initial amplitude of the signal received by the transceiving multi-turn coil is substantially the same as the initial amplitude of the signal received by the transceiving multi-turn coil, water stratums exist on both the side of the transceiving multi-turn coil and the side of the transceiving multi-turn coil (e.g. both the left and right sides).

i) The computer obtains the distance between the water stratum and the transceiving multi-turn coil by deducting the size of the transmission current and the duration of the magnetic field.

j) The computer obtains the moisture ratio of the geological region with the water stratum by deducting the initial amplitude, and obtains the permeability coefficient of the geological region with the water stratum by deducting the relaxation time.

The present invention brings about beneficial effects below. In the present invention combined with the magnetic resonance detecting theory, two receiving coils (i.e., an integrative transceiving multi-turn coil and a receiving multi-turn coil) are used to receive magnetic resonance signals at the same time, and data processing is conducted based on the received signals to locate exactly the location, size, moisture ratio and permeability coefficient of the water stratum, to offer reference data for the construction of a mine and tunnels, forecast precisely tunnel water inrush, and avoid water inrush caused by an unknown water stratum.

Numeral reference list:

1: Computer; 2: Control unit; 3: Transmitting driver circuit;
4: High voltage power source; 5: Transmitting bridge circuit;
6: First signal modulating circuit; 7: Multi-channel collecting circuit;

-continued

Numeral reference list:

8: First protection switch; 9: Crystal capacitor;
10: Second signal modulating circuit; 11: Second protection switch;
12: Transceiving multi-turn coil; 13: Receiving multi-turn coil;
14, 15, 16, 17, 18: Serial bus; 19, 20: Control line.

DETAILED DESCRIPTION OF THE EMBODIMENTS

The water stratum detecting based on the magnetic resonance differential for the purpose of forecasting the tunnel water inrush is carried out as follows.

Figure 1:
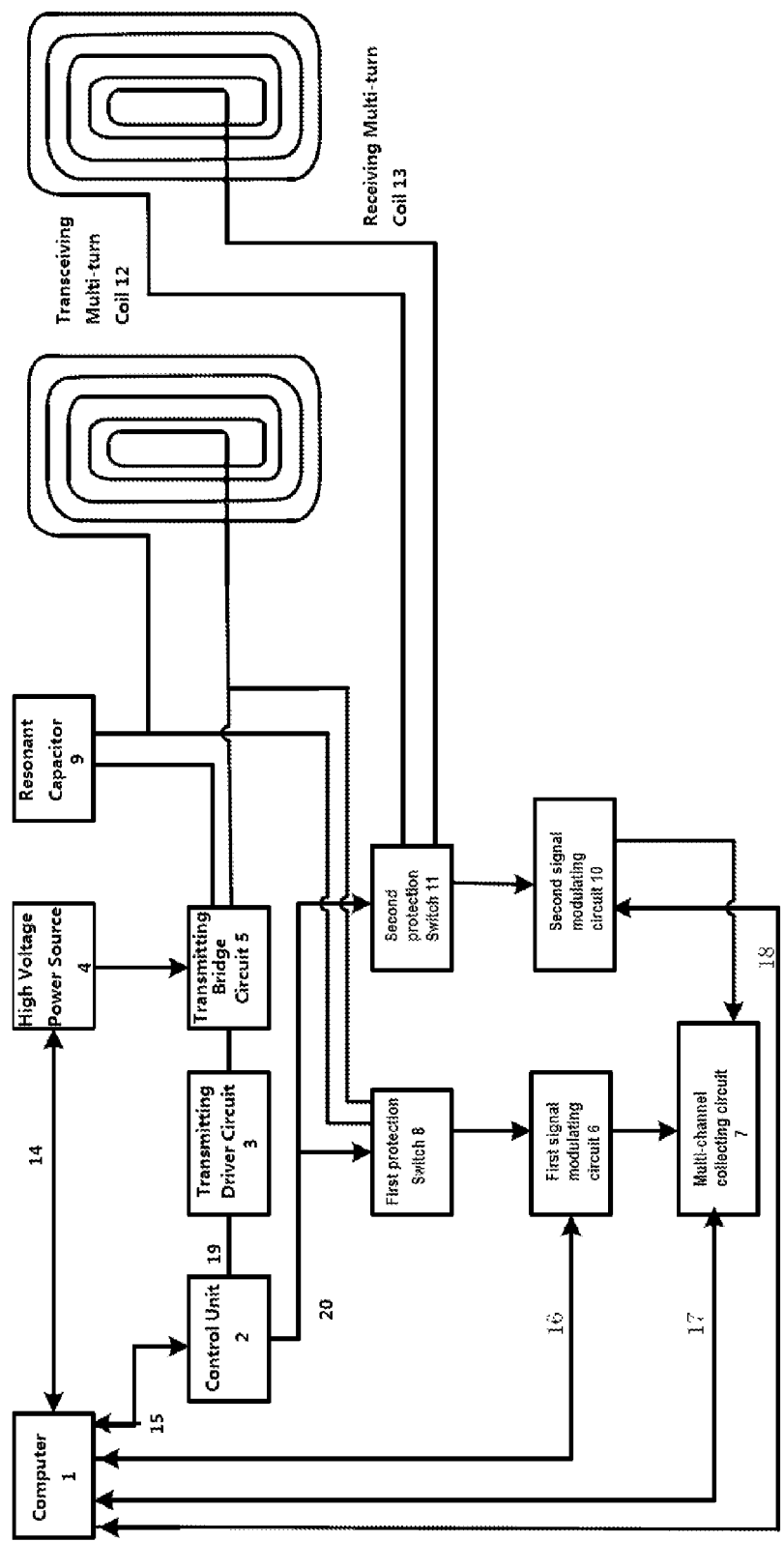
FIG. 1 is a structural diagram of the inventive equipment for forecasting tunnel water inrush using a magnetic resonance differential.

In the equipment for forecasting tunnel water inrush using the magnetic resonance differential according to the present invention, as shown in FIG. 1, a computer 1 is connected to a transmitting bridge circuit 5 via a high voltage power source 4 by a serial bus 14, is connected to a control unit 2 by a serial bus 15, is connected to a signal modulating circuit 6 by a serial bus 16, is connected to a multi-channel collecting circuit 7 by a serial bus 17, and is connected to a second signal modulating circuit 10 by a serial bus 18. The control unit 2 is connected to a transmitting driver circuit 3 by a control line 19, and is respectively connected to a first protection switch 8 and a second protection switch 11 by control lines 20 to control the opening and closing of the first protection switch 8 and the second protect switch 11. Both ends of an integrative transceiving multi-turn coil 12 (or called as an integrative transceiving coil for short) are connected to the multi-channel collecting circuit 7 by the first protection switch 8 and the first signal modulating circuit 6, and both ends of a receiving multi-turn coil 13 are connected to the multi-channel collecting circuit 7 by the second protection switch 11 and the second signal modulating circuit 10. Further, one of both ends of the transceiving multi-turn coil 12 is connected to the transmitting bridge circuit 5, and the other end of the transceiving multi-turn coil 12 is connected to the transmitting bridge circuit 5 via a resonant capacitor 9. The control unit 2 is connected to the transmitting bridge circuit 5 by the transmitting driver circuit 3. Here, the computer 1 controls the high voltage power source 4 by setting the size of the output voltage of the high voltage power source 4, and hence changes the size of transmission current in the transceiving multi-turn coil 12 and the resonant capacitor 9, so that stimulated magnetic fields with different intensities are generated to stimulate water stratums at different distances. The control unit 2 generates a control signal with a Larmor frequency of 20-30 milliseconds (MS), to control the transmitting bridge circuit 5 via the transmitting driver circuit 3.

Figure 2:
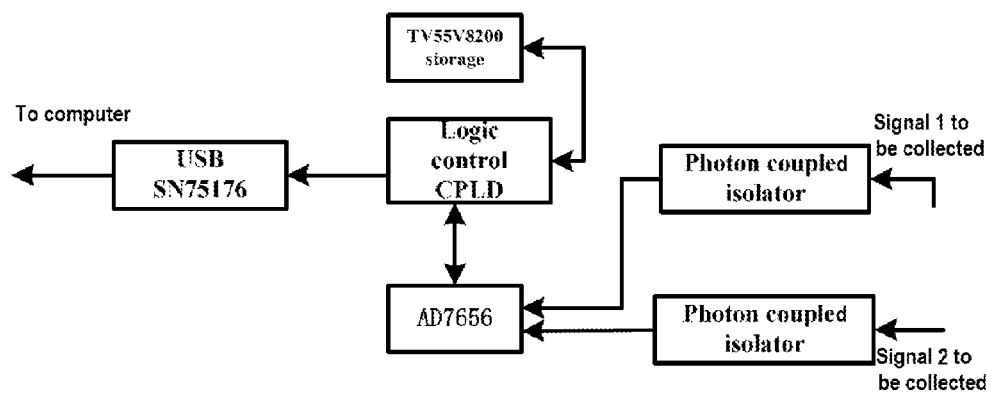
FIG. 2 is a schematic structural diagram of a multi-channel collecting circuit 7 in FIG. 1.
Figure 3:
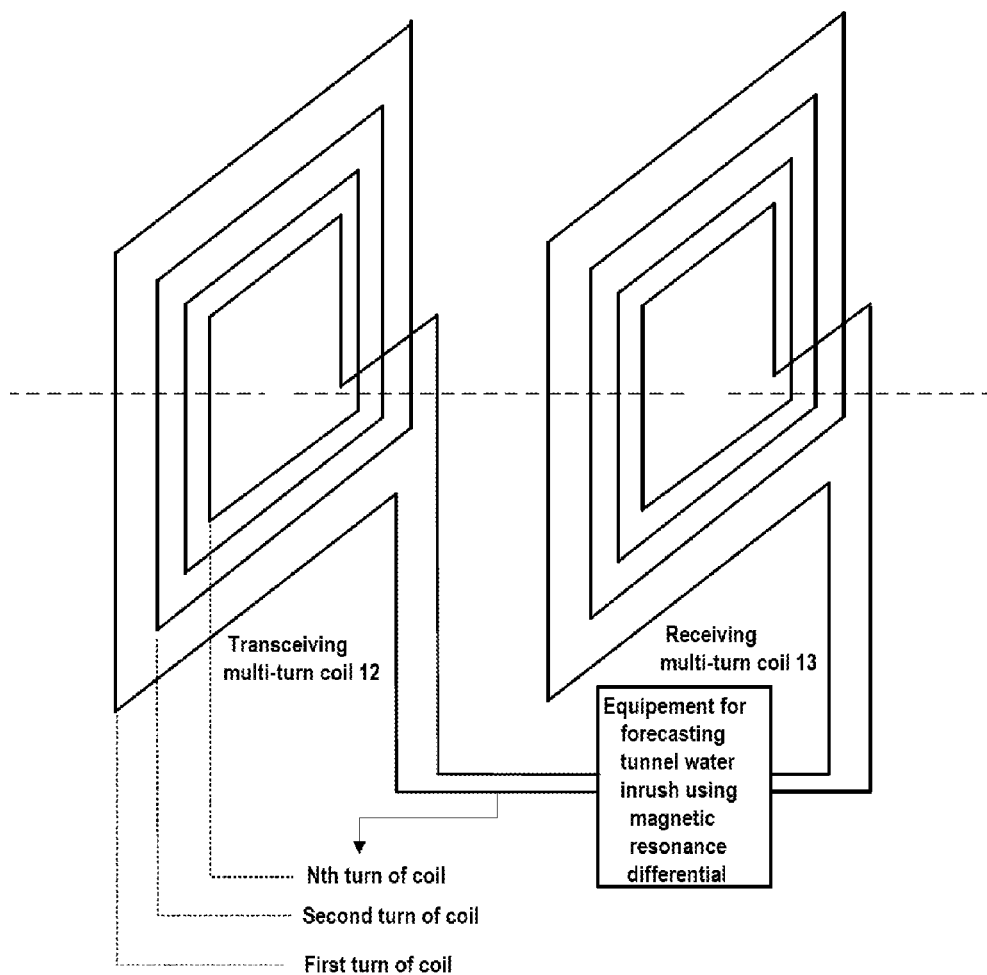
FIG. 3 is a schematic diagram showing the implementing of the method for forecasting tunnel water inrush using a magnetic resonance differential, where an integrative transceiving multi-turn coil 12 is arranged at the left side, and a receiving multi-turn coil 13 is arranged at the right side.

A signal for collecting 1 and a signal for collecting 2 shown in FIG. 2 originate from the first signal modulating circuit 6 and the second signal modulating circuit 10 shown in FIG. 1, respectively.

The method for forecasting tunnel water inrush using a magnetic resonance differential includes the following steps a)-j).

a) The transceiving multi-turn coil 12 and the receiving multi-turn coil 13 are placed in a target detection region such as two lateral sides of a tunnel, where the transceiving multi-turn coil 12 may be laid vertically on the left wall of the tunnel while the receiving multi-turn coil 13 is laid vertically on the right wall of the tunnel which is opposite to the transceiving multi-turn coil 12.

b) The above equipment for forecasting tunnel water inrush using a magnetic resonance differential is turned on, and the computer 1 sends a detecting command to the control unit 2, which thereby controls the first protection switch 8 and the second protection switch 11 to be opened so as to protect the first signal modulating circuit 6 and the second condition circuit 10.

c) The control unit 2 generates a control signal with a Larmor frequency of 20-30 ms, and controls the transmitting bridge circuit 5 via the transmitting driver circuit 3.

d) The computer 1 controls the high voltage power source 4 by the serial bus 14 to set and change the size of the output voltage of the high voltage power source 4, and further changes the size of the transmission current in the transceiving multi-turn coil 12 and the resonant capacitor 9 via the transmitting bridge circuit 5, so that stimulated magnetic fields with different intensities are generated to stimulate water stratums at different distances.

e) When a time interval of 20-30 ms expires after the emission of the stimulated magnetic field is finished, the control unit 2 controls the first protection switch 8 and the second protection switch 11 to be closed, to send the signal received by the transceiving multi-turn coil 12 to the first signal modulating circuit 6 by the first protection switch 8, and send the signal received by the receiving multi-turn coil 13 to the second signal modulating circuit 10 by the second protection switch 11.

f) The first signal modulating circuit 6 and the second signal modulating circuit 10 filter and amplify the received signals (e.g., the signal from the transceiving multi-turn coil 12 at the left side and the signal from the receiving multi-turn coil 13 at the right side), respectively, the computer 1 controls the first signal modulating circuit 6 by the serial bus 16 to amplify and filter the received signal (e.g., the signal from the transceiving multi-turn coil 12 at the left side), and then sends the amplified and filtered signal to the multi-channel collecting circuit 7. Further, the computer 1 controls the second signal modulating circuit 10 by the serial bus 18 to amplify and filter the received signal (e.g., the signal from the receiving multi-turn coil 13 at the right side), and then sends the amplified and filtered signal to the multi-channel collecting circuit 7. The computer 1 controls the starting and ending time of the signal collection conducted by the multi-channel collecting circuit 7 by the serial bus 17. The analog signals outputted from the first signal modulating circuit 6 and the second signal modulating circuit 10 are converted into digital signals by an Analog-to-Digital (A/D) converter of the multi-channel collecting circuit 7, and then the digital signals obtained from the conversion are sent to the computer 1 via the serial bus 17 for further storing and processing.

g) The magnetic resonance signals received by the transceiving multi-turn coil 12 and the receiving multi-turn coil 13 are processed by the computer 1 to obtain parameters such as relaxation time, initial amplitude and phase shift.

h) The computer 1 determines the relative location of the water stratum by differential deduction. If the initial amplitude of the signal received by the transceiving multi-turn coil 12 is higher than the initial amplitude of the signal received by the receiving multi-turn coil 13, the water stratum is on the side of the placed transceiving multi-turn coil 12 (e.g. the left side); if the initial amplitude of the signal received by the transceiving multi-turn coil 12 is lower than the initial amplitude of the signal received by the receiving multi-turn coil 13, the water stratum is on the side of the placed receiving multi-turn coil 13 (e.g. the right side). If the initial amplitude of the signal received by the transceiving multi-turn coil 12 is substantially the same as the initial amplitude of the signal received by the receiving multi-turn coil 13, water stratums exist on both the side of the transceiving multi-turn coil 12 and the side of the receiving multi-turn coil 13 (e.g. both the left and right sides).

i) The computer 1 obtains the distance between the water stratum and the transceiving multi-turn coil 12 by deducting the size of the transmission current and the duration of the magnetic field.

j) The computer 1 obtains the moisture ratio of the geological region with the water stratum by deducting the initial amplitude, and obtains the permeability coefficient of the geological region with the water stratum by deducting the relaxation time.

The specific working process of the inventive equipment is described particularly below with an example where the equipment is arranged on the left and right sides of a detected point in the tunnel.

The transceiving multi-turn coil 12 is installed in an installation plane which is a vertical plane at the left side of a detected point in the tunnel, and the receiving multi-turn coin 13 is installed in an installation plane which is a vertical plane opposite to the transceiving multi-turn coil 12 (i.e., at the right side of the detected point of the tunnel); Through the control line 20, the control unit 2 controls the first protection switch 8 and the second protection switch 11 to be opened to protect the first signal modulating circuit 6 and the second signal modulating circuit 10; further, the control unit 2 generates a control signal with a local Larmor frequency of 20-30 ms, and controls the transmitting bridge circuit 5 by the transmitting driver circuit 3; the computer 1 controls the high voltage power source 4 by the serial bus 14 to set and change the size of the output voltage of the high voltage power source 4, and hence changes the size of the transmission current in the transceiving multi-turn coil 12 and the resonant capacitor 9 by the transmitting bridge circuit 5, so that the stimulated magnetic fields with different intensities are generated to stimulate water stratums at different distances. When a time interval of 20-30 ms expires after the emission of the stimulated magnetic field is finished, the control unit 2 controls the first protection switch 8 and the second protection switch 11 to be closed, to send the signal received by the transceiving multi-turn coil 12 to the first signal modulating circuit 6 by the first protection switch 8, and send the signal received by the receiving multi-turn coil 13 to the second signal modulating circuit 10 by the second protection switch 11. The signal received from the left side is filtered and amplified by the first signal modulating circuit 6, and the signal received from the right side is filtered and amplified by the second signal modulating circuit 10.

Through the serial bus 16, the computer 1 controls the first signal modulating circuit 6 to amplify and filter the weak signal received from the left side and then sends the amplified and filtered signal to the multi-channel collecting circuit 7; also, through the serial bus 18, the computer 1 controls the second signal modulating circuit 10 to amplify and filter the weak signal received from the right side, and then sends the amplified and filtered signal to the multi-channel collecting circuit 7. Through the serial bus 17, the computer 1 controls the starting and ending time of the signal collection conducted by the multi-channel collecting circuit 7. The analog signals outputted from the first signal modulating circuit 6 and the second signal modulating circuit 10 are converted into digital signals by an Analog-to-Digital (A/D) converter of the multi-channel collecting circuit 7, and then the digital signals obtained from the conversion are sent to the computer 1 via the serial bus 17 for further storing and processing. The computer 1 extracts characteristic parameters such as relaxation time, initial amplitude and phase shift from the magnetic resonance signals received from the transceiving multi-turn coil 12 and the receiving multi-turn coil 13, thereby conducting the deduction using a software for forecasting tunnel water inrush based on a magnetic resonance differential. If the initial amplitude of the signal received by the transceiving multi-turn coil 12 is higher than that of the signal received by the receiving multi-turn coil 13, the water stratum is at the left side; on the contrary, if the initial amplitude of the signal received by the transceiving multi-turn coil 12 is lower than that of the signal received by the receiving multi-turn coil 13, the water stratum is at the right side; and if the initial amplitude of the signal received by the transceiving multi-turn coil 12 is substantially the same as that of the signal received by the receiving multi-turn coil 13, water stratums exist at both the left and right sides.

The distance between the water stratum and the transceiving multi-turn coil 12 can be obtained by deducting the size of the transmission current for the magnetic field and the duration of the magnetic field. The moisture ratio may be obtained by deducting the initial amplitude of the signal calculated by the computer 1. The permeability coefficient of the geological region with the water stratum can be obtained by deducting the relaxation time calculated by the computer 1. The parameters such as the relaxation time, initial amplitude and phase shift can be obtained by the computer 1 based on the magnetic resonance signals received from the transceiving multi-turn coil 12 and the receiving multi-turn coil 13. The moisture ratio of the geological region with the water stratum can be obtained by deducting the initial amplitude, and the permeability coefficient of the geological region with the water stratum can be obtained by deducting the relaxation time. The deduction algorithm mentioned herein is well known in the art, and may be found in the master dissertation by Chuandong Jiang from Jilin University in 2009 with a title of Design and Application of Data Processing Software For Groundwater Detection Based On Magnetic Resonance, for example, which is not repeatedly discussed herein.

The above description is made in an example of detecting water stratums on the left and right sides of the tunnel. When the coils in the above embodiments are arranged at the up and down sides instead of the left and right sides of the tunnel, water stratums at the roof and the baseboard of the tunnel can be detected for forecasting any water inrush. To forecast the water inrush into a tunnel along the advance direction of the tunnel, a water stratum in the front of the tunnel can be detected by vertically placing the transceiving multi-turn coin 12 in the tunnel face along the advance direction of the tunnel.

What is claimed:

1. An equipment for forecasting tunnel water inrush using a magnetic resonance differential, characterized in that: a computer is connected to a transmitting bridge circuit via a high voltage power source by a first serial bus, is connected to a control unit by a second serial bus, is connected to a first signal modulating circuit by a third serial bus, is connected to a multi-channel collecting circuit by a fourth serial bus, and is connected to a second signal modulating circuit by a fifth serial bus; the control unit is connected to a transmitting driver circuit by a control line, and is respectively connected to a first protection switch and a second protection switch by control lines to control the opening and closing of the first protection switch and the second protect switch; both ends of an integrative transceiving multi-turn coil are connected to the multi-channel collecting circuit by the first protection switch and the first signal modulating circuit, and both ends of a receiving multi-turn coil are connected to the multi-channel collecting circuit by the second protection switch and the second signal modulating circuit; one of both ends of the transceiving multi-turn coil is connected to the transmitting bridge circuit, and the other end of the transceiving multi-turn coil is connected to the transmitting bridge circuit via a resonant capacitor; the control unit is connected to the transmitting bridge circuit by the transmitting driver circuit; wherein, the computer controls the high voltage power source by setting an amount of the output voltage of the high voltage power source, and hence changes an amount of transmission current in the transceiving multi-turn coil and the resonant capacitor through the transmitting bridge circuit, so that stimulated magnetic fields with different intensities are generated to stimulate water stratums at different distances; the control unit generates a control signal with a Larmor frequency of 20-30 milliseconds (ms), to control the transmitting bridge circuit via the transmitting driver circuit.

2. A method for forecasting tunnel water inrush using a magnetic resonance differential comprising steps of:
   a) placing a transceiving multi-turn coil and a receiving multi-turn coil in a target detection region;
   b) turning on an equipment for forecasting tunnel water inrush using a magnetic resonance differential, wherein a computer sends a detecting command to a control unit, which thereby controls a first protection switch and a second protection switch to be opened so as to protect a first signal modulating circuit and a second signal modulating circuit;
   c) generating, by the control unit, a control signal with a Larmor frequency of 20-30 ms, and controlling a transmitting bridge circuit via a transmitting driver circuit;
   d) controlling, by the computer, a high voltage power source by a first serial bus to set and change an amount of an output voltage of the high voltage power source, and further changing an amount of the transmission current in the transceiving multi-turn coil and a resonant capacitor via the transmitting bridge circuit, so that stimulated magnetic fields with different intensities are generated to stimulate water stratums at different distances;
   e) when a time interval of 20-30 ms expires after the emission of the stimulated magnetic field is finished, controlling, by the control unit, the first protection switch and the second protection switch to be closed, to send the signal received by the transceiving multi-turn coil to the first signal modulating circuit by the first protection switch, and send the signal received by the receiving multi-turn coil to the second signal modulating circuit by the second protection switch;
   f) filtering and amplifying, by the first signal modulating circuit and the second signal modulating circuit, the received signals, respectively, wherein the computer controls the first signal modulating circuit by a second serial bus to amplify and filter the received signal, and then sends the amplified and filtered signal to a multi-channel collecting circuit; the computer controls the second signal modulating circuit by a third serial bus to amplify and filter the received signal, and then sends the amplified and filtered signal to the multi-channel collecting circuit; the computer controls the starting and ending time of the signal collection conducted by the multi-channel collecting circuit by a fourth serial bus; analog signals outputted from the first signal modulating circuit and the second signal modulating circuit are converted into digital signals by an Analog-to-Digital converter of the multi-channel collecting circuit, and then the digital signals obtained from the conversion are sent to the computer via the fourth serial bus for further storing and processing;

g) processing, by the computer, the magnetic resonance signals received by the transceiving multi-turn coil and the receiving multi-turn coil to obtain parameters including relaxation time, initial amplitude and phase shift;

h) determining the relative location of the water stratum by differential deduction, wherein, if the initial amplitude of the signal received by the transceiving multi-turn coil is higher than the initial amplitude of the signal received by the receiving multi-turn coil, the water stratum is on the side of the placed transceiving multi-turn coil; if the initial amplitude of the signal received by the transceiving multi-turn coil is lower than the initial amplitude of the signal received by the receiving multi-turn coil, the water stratum is on the side of the placed receiving multi-turn coil; and if the initial amplitude of the signal received by the transceiving multi-turn coil is substantially the same as the initial amplitude of the signal received by the receiving multi-turn coil, water stratums exist on both the side of the transceiving multi-turn coil and the side of the receiving multi-turn coil;

i) obtaining, by the computer, a distance between the water stratum and the transceiving multi-turn coil by deducting an amount of the transmission current and the duration of the magnetic field; and j) obtaining, by the computer, a moisture ratio of the geological region with the water stratum by deducting the initial amplitude, and obtaining a permeability coefficient of the geological region with the water stratum by deducting the relaxation time.

3. The method of claim 2, wherein, the receiving multi-turn coil is opposite to the transceiving multi-turn coil.

* * * * *